US007548708B2

(12) United States Patent
Nagasaki et al.

(10) Patent No.: US 7,548,708 B2
(45) Date of Patent: Jun. 16, 2009

(54) POWER SUPPLY UNIT IN IMAGE FORMING APPARATUS

(75) Inventors: Osamu Nagasaki, Numazu (JP); Atsuhiko Yamaguchi, Izu (JP); Tomohiro Nakamori, Yokohama (JP); Takehiro Uchiyama, Shizuoka-ken (JP); Kouji Yasukawa, Susono (JP); Teruhiko Namiki, Mishima (JP); Hiroki Murata, Shizuoka-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 434 days.

(21) Appl. No.: 11/275,634

(22) Filed: Jan. 20, 2006

(65) Prior Publication Data

US 2006/0222398 A1 Oct. 5, 2006

(30) Foreign Application Priority Data

Apr. 1, 2005 (JP) ............................ 2005-106785

(51) Int. Cl.
*G03G 15/00* (2006.01)
*H01L 41/00* (2006.01)

(52) U.S. Cl. .......................... 399/88; 310/318; 323/355

(58) Field of Classification Search .................. 399/37, 399/88, 89; 310/314, 318, 319; 315/209 PZ, 315/55; 323/355
See application file for complete search history.

(56) References Cited

U.S. PATENT DOCUMENTS 5,705,877 A * 1/1998 Shimada .................... 310/318
5,923,542 A * 7/1999 Sasaki et al. ................. 363/16
5,965,868 A 10/1999 Nakamori
6,151,232 A * 11/2000 Furuhashi et al. ............ 363/97
6,268,681 B1 * 7/2001 Yamaguchi et al. .... 310/316.01
7,034,800 B2 * 4/2006 Nakatsuka et al. .......... 345/102
7,196,475 B2 * 3/2007 Saito et al. .................... 315/55
7,265,479 B2 * 9/2007 Yamaguchi et al. ......... 310/318
2006/0220495 A1 10/2006 Yamaguchi et al.
2006/0222398 A1 * 10/2006 Nagasaki et al. ............. 399/88
2006/0273688 A1 12/2006 Yasukawa et al.
2007/0007855 A1 * 1/2007 Murata et al. ............... 310/317
2007/0025753 A1 * 2/2007 Saito et al. .................... 399/88

FOREIGN PATENT DOCUMENTS

JP 11299248 A * 10/1999

* cited by examiner

*Primary Examiner*—Robert Beatty
(74) *Attorney, Agent, or Firm*—Fitzpatrick, Cella, Harper & Scinto

(57) ABSTRACT

A power supply unit in an image forming apparatus is provided. The power supply unit includes a piezoelectric transformer, an output voltage detecting circuit which detects the output voltage of the piezoelectric transformer, an output voltage control circuit which controls an output voltage from the piezoelectric transformer, and includes a comparator which receives an output voltage setting signal, together with an output voltage detecting signal fed back from the output voltage detecting circuit, to compare the output voltage setting signal and the output voltage detecting signal. The power supply unit also includes a driving frequency supplying circuit which generates a driving frequency signal of the piezoelectric transformer in accordance with a comparison result by the comparator, and supplies the driving frequency signal to the piezoelectric transformer. The time constant of the output voltage control circuit is longer than the time constant of the output voltage detecting circuit.

12 Claims, 10 Drawing Sheets

POWER SUPPLY UNIT IN IMAGE FORMING APPARATUS

FIELD OF THE INVENTION

The present invention relates to a power supply unit in an image forming apparatus.

BACKGROUND OF THE INVENTION

When an image forming apparatus of an electrophotographic method adopts a direct transfer system of transferring an image by bringing a transfer member into contact with a photoconductor, the transfer member uses a conductive rubber roller (transfer roller) having a conductive shaft to rotate and drive the transfer member while matching the process speed of the photoconductor. A voltage applied to the transfer member is a DC bias voltage. At this time, the polarity of the DC bias voltage is identical to that of a transfer voltage for general corona discharge.

To achieve satisfactory transfer using the transfer roller, a voltage of generally 3 kV or more (the required current is several μA) must be applied to the transfer roller. This high voltage necessary for the image forming process is conventionally generated using a wire-wound electromagnetic transformer. The electromagnetic transformer is made up of a copper wire, bobbin, and core. When the electromagnetic transformer is used in the above specification, the leakage current must be minimized at each portion because the output current value is as small as several μA. For this purpose, the windings of the transformer must be molded with an insulator, and the transformer must be made large in comparison with supply power. This inhibits downsizing and weight reduction of a high-voltage power supply apparatus.

In order to compensate for these drawbacks, it is proposed to generate a high voltage by using a flat, light-weight, high-output piezoelectric transformer. By using, for example, a piezoelectric transformer formed from ceramic, the piezoelectric transformer can generate a high voltage more efficiently than in the use of the electromagnetic transformer. Since electrodes on the primary and secondary sides can be spaced apart from each other regardless of coupling between the primary and secondary sides, no special molding is necessary for insulation, thus making a high-voltage generation apparatus compact and lightweight.

Unfortunately, the high-voltage power supply apparatus using the conventional piezoelectric transformer cannot sometimes control the output voltage, so the circuit operation oscillates. Such a phenomenon degrades printing quality. That is, it is difficult to simply adopt, as a power supply unit in an image forming apparatus, the high-voltage power supply apparatus using the conventional piezoelectric transformer. Hence, it is demanded to realize stable voltage control free from any circuit oscillation.

SUMMARY OF THE INVENTION

In view of the above problems in the conventional art, the present invention has an object to realize stable voltage control free from any circuit oscillation in a power supply unit for an image forming apparatus using a piezoelectric transformer, thereby preventing degradation of printing quality of the image forming apparatus.

In one aspect of the present invention, a power supply unit in an image forming apparatus includes a piezoelectric transformer, an output voltage detecting circuit which detects the output voltage of the piezoelectric transformer, a comparator which receives an output voltage setting signal, together with an output voltage detecting signal fed back from the output voltage detecting circuit, to compare the output voltage setting signal and the output voltage detecting signal, and a driving frequency supplying circuit which generates the driving frequency of the piezoelectric transformer in accordance with a comparison result by the comparator, and supplies the resultant driving frequency to the piezoelectric transformer. The time constant of the output voltage setting signal is longer than the time constant of the output voltage detecting circuit.

The above and other objects and features of the present invention will appear more fully hereinafter from a consideration of the following description taken in connection with the accompanying drawing wherein one example is illustrated by way of example.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings. The present invention is not limited by the disclosure of the embodiments and all combinations of the features described in the embodiments are not always indispensable to solving means of the present invention.

First Embodiment

Figure 2:
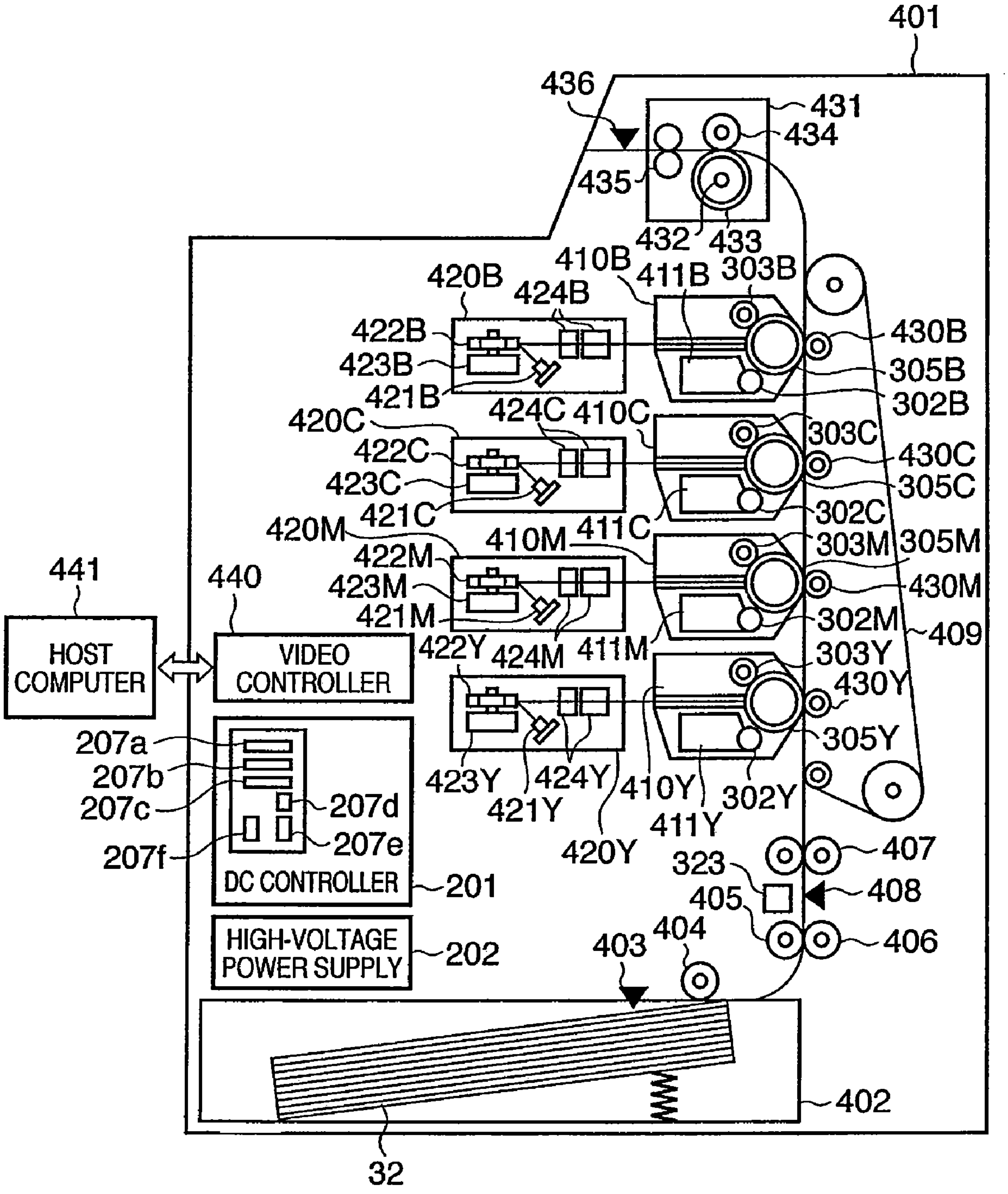
FIG. 2 is a view showing the arrangement of an image forming apparatus according to the first embodiment of the present invention.

FIG. 2 is a view showing an arrangement example of a color laser printer serving as an example of an image forming apparatus according to this embodiment. Note that the present invention is not limited to the color laser printer, and can be applied to various image forming apparatuses.

For example, the image forming apparatus is a color laser printer of a so-called tandem system. In a color laser printer 401 shown in FIG. 2, a deck 402 stores printing paper sheets 32. A paper sensor 403 detects the presence/absence of the printing paper sheets 32 in the deck 402. A pickup roller 404 picks up a printing paper sheet 32 from the deck 402. A paper feed roller 405 conveys the printing paper sheet 32 picked up by the pickup roller 404. A retardation roller 406 is paired with the paper feed roller 405 to prevent double feed of the printing paper sheet 32.

A registration roller pair 407 is arranged downstream of the paper feed roller 405 to synchronously convey the printing paper sheet 32. A paper feed sensor 408 detects the conveyance state of the printing paper sheet 32 to the registration roller pair 407. An electrostatic adsorptive feeding transfer belt (to be referred to as an "ETB" hereinafter) 409 is arranged downstream of the registration roller pair 407. An image forming unit includes process cartridges 410Y, 410M, 410C, and 410B and scanner units 420Y, 420M, 420C, and 420B (to be described later) corresponding to four colors (Yellow Y, Magenta M, Cyan C, and Black B). Images formed by the image forming unit are sequentially overlaid on the ETB 409 by transfer rollers 430Y, 430M, 430C, and 430B, thereby forming a color image. The resultant color image is transferred and conveyed onto the printing paper sheet 32.

A fixing unit 431 is arranged further downstream to thermally fix the toner image transferred onto the printing paper sheet 32. The fixing unit 431 includes a fixing roller 433 having a built-in heater 432, a pressurizing roller 434 for pressing the fixing roller 433, and a pair of fixing/delivery rollers 435 for conveying the printing paper sheet 32 from the fixing roller 433. Furthermore, a fixing/delivery sensor 436 is arranged downstream of the fixing unit 431 to detect the paper conveyance state from the fixing unit 431.

Each scanner unit 420 includes a laser unit 421, polygon mirror 422, scanner motor 423, and imaging lens group 424. The laser unit 421 emits a laser beam modulated on the basis of each image signal sent from a video controller 440 (to be described later). The polygon mirror 422, scanner motor 423, and imaging lens group 424 are prepared to scan the laser beam from each laser unit 421 on a corresponding photosensitive drum 305.

Each process cartridge 410 includes the photosensitive drum 305 necessary for the known electrophotographic printing process, a charge roller 303, a developing roller 302, and a toner container 411, and is detachable from the laser printer 401.

Upon receiving image data sent from a host computer 441 as an external device, the video controller 440 rasterizes the image data into bit map data to generate an image signal for image formation.

A DC controller 201 serves as a control unit for the laser printer. The DC controller 201 includes an MPU (Micro Processing Unit) 207 and various input/output control circuits (not shown). The MPU 207 includes a RAM 207*a*, ROM 207*b*, timer 207*c*, digital input/output port 207*d*, D/A port 207*e*, and A/D port 207*f*, as shown in FIG. 2.

A high-voltage power supply unit 202 includes, e.g., a charge high-voltage power supply unit for applying a voltage to each charge roller 303, a developing high-voltage power supply unit for applying a voltage to each developing roller 302, and a transfer high-voltage power supply unit for applying a voltage to each transfer roller 430.

The arrangement of the transfer high-voltage power supply unit according to this embodiment will be described next with reference to the block diagram shown in FIG. 4. The high-voltage power supply unit according to the present invention is effective to both positive- and negative-voltage output circuits. Therefore, the transfer high-voltage power supply unit which requires a positive voltage will be exemplified here. Although the transfer high-voltage power supply unit has four circuits corresponding to the respective transfer rollers 430Y, 430M, 430C, and 430B, they have the same circuit arrangement. Therefore, only one circuit will be described with reference to FIG. 4.

The DC controller 201 serving as an output voltage setting means outputs an output voltage setting signal $V_{cont}$ under the control of the MPU 207. The output voltage setting signal $V_{cont}$ from the DC controller 201 is input to an integrating circuit (comparator) 203 serving as an output voltage control circuit consisting of an operation amplifier and the like arranged on the high-voltage power supply unit 202. The input voltage is converted into a frequency signal through a voltage-controlled oscillator (VCO) 110. The resultant frequency signal drives a switching circuit 204. A piezoelectric transformer (piezoelectric ceramic transformer) 101 then outputs a voltage corresponding to its frequency characteristic and step-up ratio. A rectifying circuit 205 rectifies and smoothes an output from the piezoelectric transformer 101 to a positive voltage. After that, a high-voltage output $V_{out}$ 208 applies a high voltage to a transfer roller (not shown) serving as a load. The rectified voltage is also fed back to the comparator 203 through an output voltage detecting circuit 206, and controlled such that an output voltage detecting signal $V_{sns}$ and the output voltage setting signal $V_{cont}$ have the same potential.

Figure 1:
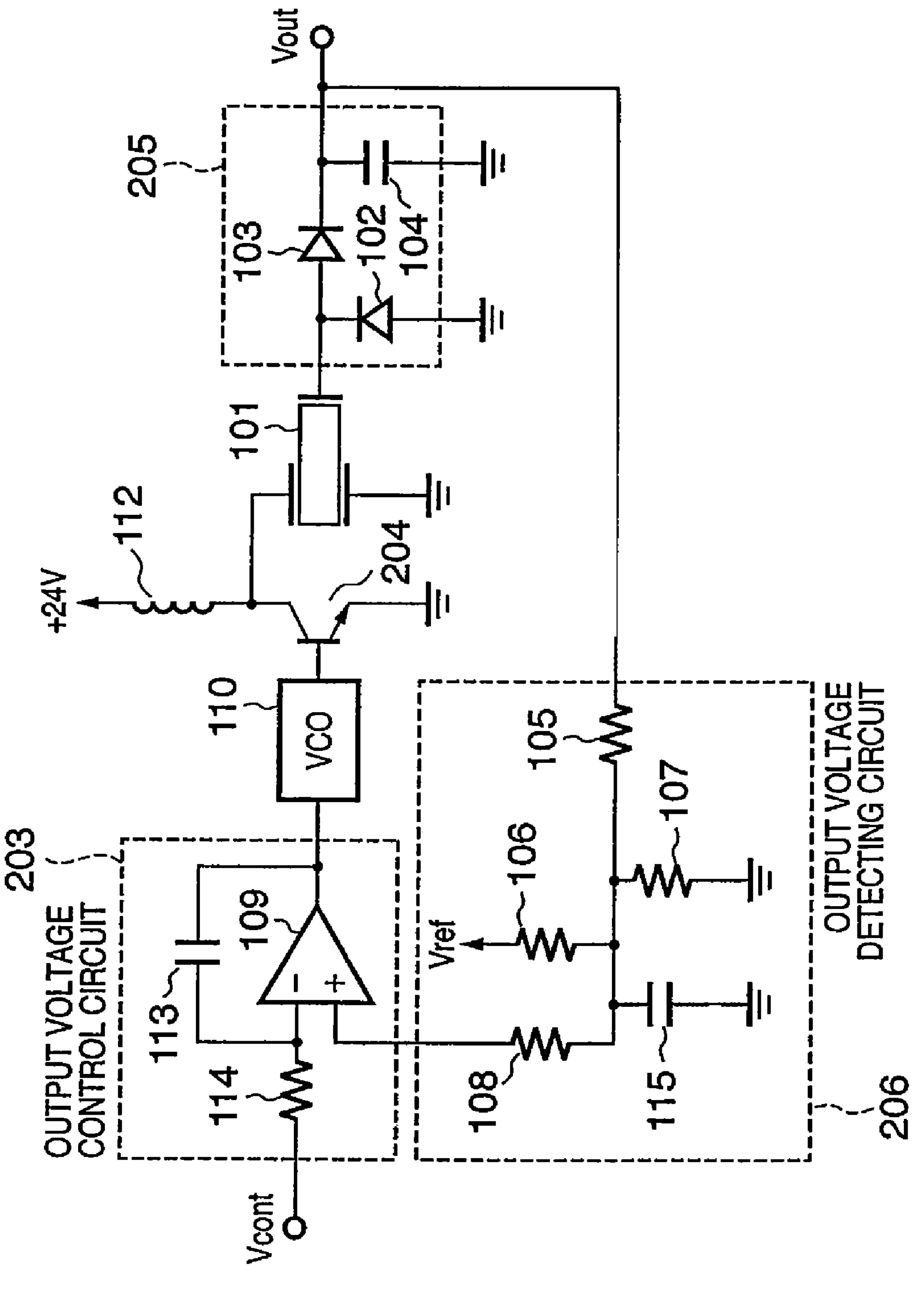
FIG. 1 is a circuit diagram showing a high-voltage power supply unit using a piezoelectric transformer according to the first embodiment of the present invention.
Figure 4:
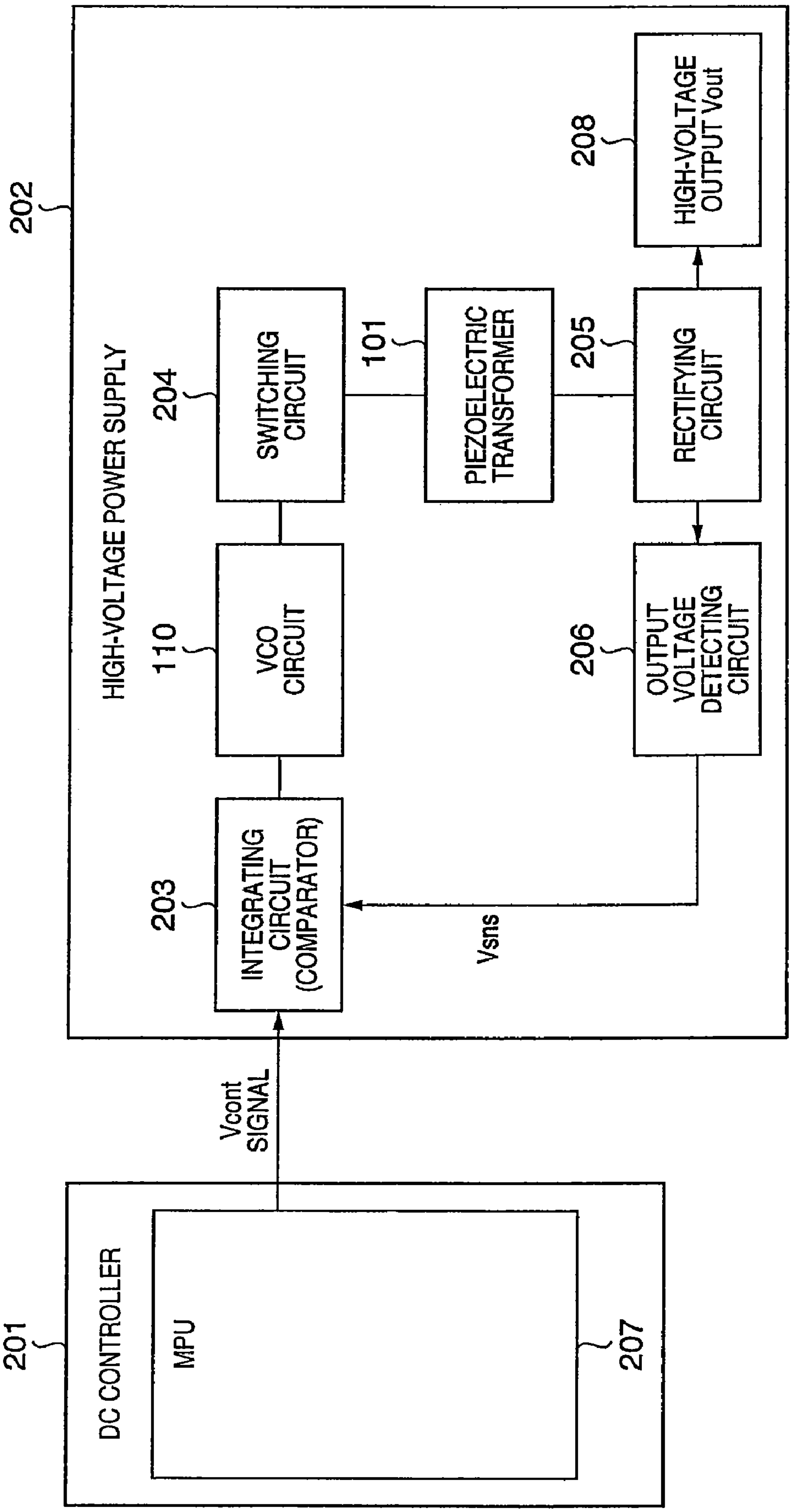
FIG. 4 is a block diagram showing the arrangement of a transfer high-voltage power supply unit according to the first embodiment of the present invention.

The transfer high-voltage power supply unit having the arrangement shown in FIG. 4 can be implemented by the circuit of FIG. 1. As described above, the output voltage setting signal $V_{cont}$ is output from the DC controller 201. Referring to FIG. 1, the output voltage setting signal $V_{cont}$ is input to, through a resistor 114, the inverting input terminal (negative terminal) of an operation amplifier 109 which forms the integrating circuit 203.

To the contrary, an output voltage $V_{out}$ is divided by resistors 105, 106, and 107 of the output voltage detecting circuit 206. Then, the output voltage detecting signal $V_{sns}$ is input to the noninverting input terminal (positive terminal) of the operation amplifier 109 through a capacitor 115 and protective resistor 108. The output terminal of the operation amplifier 109 is connected to the voltage-controlled oscillator (VCO) 110. The output terminal of the voltage-controlled oscillator 110 is connected to the base of a transistor 204 serving as a switching circuit. The collector of the transistor 204 is connected to a power supply (+24 V) through an inductor 112, and simultaneously connected to one electrode of the piezoelectric transformer 101 on the primary side. An output from the piezoelectric transformer 101 is rectified and smoothed by diodes 102 and 103 and a high-voltage capacitor 104 which form the rectifying circuit 205, and applied to the transfer roller (not shown) serving as the load.

Figure 3:
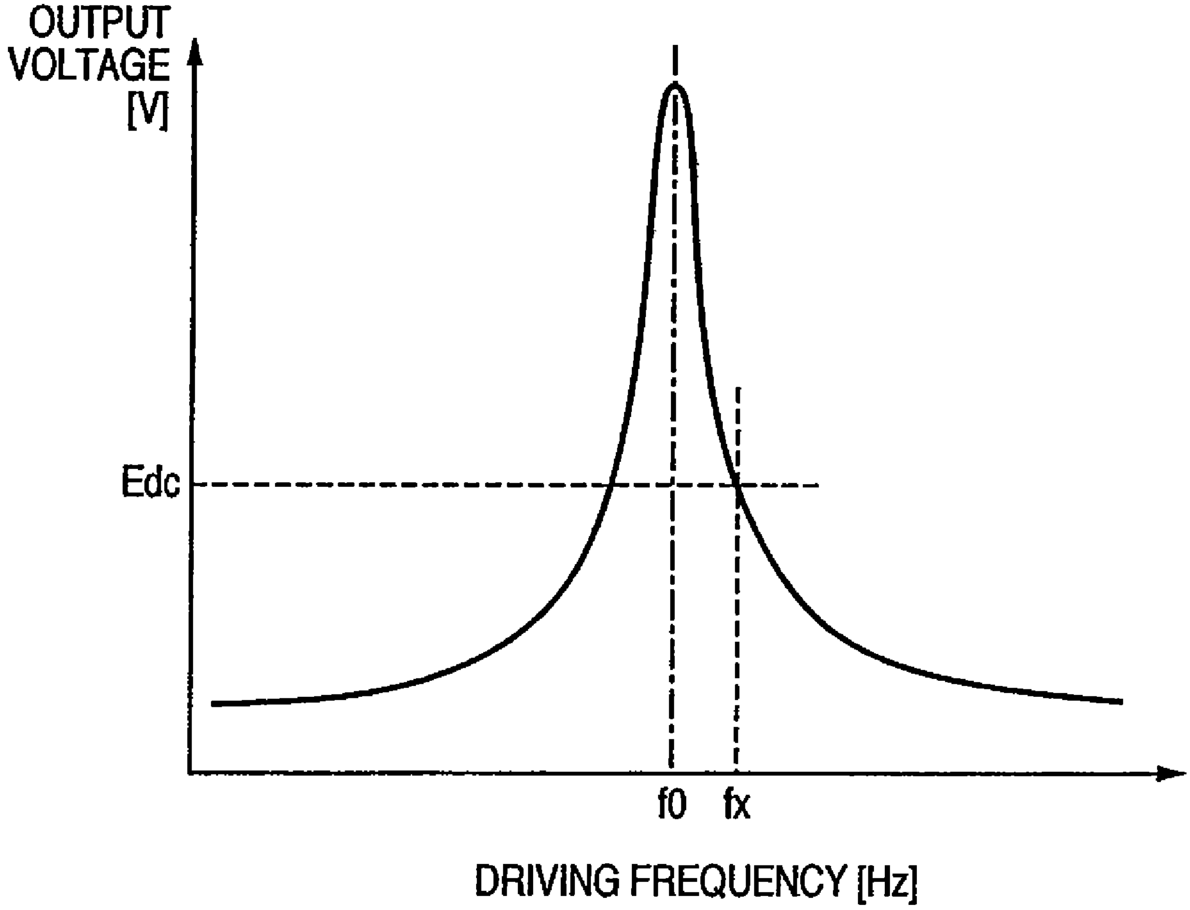
FIG. 3 is a graph representing the characteristic of the output voltage with respect to the driving frequency of a piezoelectric transformer.

The characteristic of the piezoelectric transformer 101 generally has a bell shape representing that the output voltage becomes maximum at a resonance frequency f0, as shown in FIG. 3. Hence, it is possible to control the output voltage by frequency. The output voltage of the piezoelectric transformer 101 can be increased by changing the driving frequency from high to low.

Let fx be the driving frequency when a specified output voltage Edc is output. The voltage-controlled oscillator (VCO) 110 serving as a driving frequency generation means operates to increase the output frequency when the input voltage rises, and decrease it when the input voltage drops. Under this condition, when the output voltage Edc of the piezoelectric transformer 101 rises, the input voltage $V_{sns}$ of the noninverting input terminal (positive terminal) of the operation amplifier rises, resulting in an increase in voltage of the output terminal of the operation amplifier 109. Since the input voltage of the voltage-controlled oscillator 110 rises, the driving frequency of the piezoelectric transformer 101 increases. Hence, the piezoelectric transformer 101 is driven at a slightly higher frequency than the driving frequency fx. With the increase in driving frequency, the output voltage of the piezoelectric transformer 101 drops. As a result, the piezoelectric transformer 101 controls the output voltage to a lower one. That is, the circuitry forms a negative feedback control circuit.

On the other hand, when the output voltage Edc drops, the input voltage $V_{sns}$ of the operation amplifier 109 also drops. As a result, the voltage of the output terminal of the operation amplifier 109 drops. Since the output frequency of the voltage-controlled oscillator 110 decreases, the piezoelectric transformer 101 controls the output voltage to a higher one. In this fashion, the output voltage is controlled to a constant voltage so as to be equal to a voltage determined by the voltage (setting voltage: to be also denoted by $V_{cont}$ hereinafter) of the output voltage setting signal $V_{cont}$ from the DC controller 201 input to the inverting input terminal (negative terminal) of the operation amplifier.

As shown in FIG. 1, the output voltage control circuit (integrating circuit) 203 includes the operation amplifier 109, the resistor 114, and a capacitor 113. The output voltage setting signal $V_{cont}$ is input to the operation amplifier 109 depending on a time constant $T_{cont}$ determined by the component constants of the resistor 114 and capacitor 113. In this case, as the resistance value of the resistor 114 increases, the time constant $T_{cont}$ becomes larger. As the capacitance of the capacitor 113 increases, a time constant $T_{sns}$ of the output voltage detecting signal $V_{sns}$ becomes larger.

The output voltage detecting circuit 206 includes the resistors 105, 106, and 107 and capacitor 115. The output voltage detecting signal $V_{sns}$ is input to the operation amplifier depending on the time constant $T_{sns}$ determined by the component constants of the resistors 105, 106, and 107 and capacitor 115.

With the above arrangement, the rise/fall time of the output voltage is controlled by a frequency change rate Δf of the voltage-controlled oscillator (VCO) 110. The frequency change rate Δf is determined by the output voltage of the operation amplifier 109. The operation amplifier 109 outputs a voltage in accordance with the comparison result between the output voltage setting signal $V_{cont}$ input to its inverting input terminal (negative terminal) through the integrating circuit 203 and the output voltage detecting signal $V_{sns}$ input to its noninverting input terminal (positive terminal).

Consider a case in which the output voltage rises to a target voltage set by the output voltage setting signal $V_{cont}$. Assume that the time constant $T_{cont}$ of the output voltage setting signal $V_{cont}$ is smaller than the time constant $T_{sns}$ of the output voltage detecting signal $V_{sns}$, i.e., $T_{cont}<T_{sns}$.

In this case, the relationship of $V_{cont}>V_{sns}$ always holds until the output voltage value reaches the target value from the beginning of the voltage rise. Since the output voltage of the operation amplifier 109 increases due to a feedback delay, the frequency change rate Δf becomes very large. As a result, the driving frequency of the piezoelectric transformer 101 becomes equal to or lower than the resonance frequency f0, and hence the output voltage possibly becomes uncontrollable.

Also in general, when the output voltage setting signal $V_{cont}$ and output voltage detecting signal $V_{sns}$ are compared, the detection side is always delayed. This disables the normal feedback operation, so the circuit operation sometimes oscillates.

As described above, when oscillation occurs in controlling the frequency change rate Δf by the voltage-controlled oscillator (VCO) 110, a ripple voltage is generated in the output voltage. As a result, a striped pattern appears in a printed image, degrading printing quality. Hence, a high-voltage power supply unit using a piezoelectric transformer is demanded to control the voltage-controlled oscillator (VCO) 110 without circuit oscillation.

To solve this problem, in this embodiment, the constants of the resistor 114, capacitor 113, resistors 105, 106, and 107, and capacitor 115 are so decided as to satisfy:

$$T_{cont}>T_{sns}$$

$$T_{cont=R}114\times C113$$

$$T_{sns=Rs\times}C115$$

where Rs is the combined resistance of the resistors R105, R106, and R107). With this arrangement, the voltage-controlled oscillator 110 can be controlled without any oscillation.

Where, in this exemplary embodiment, the time constant $T_{cont}$ of the output voltage setting signal $V_{cont}$ is set to 5 msec, and the time constant $T_{sns}$ of the output voltage detecting signal $V_{sns}$ is set to 1 msec.

If the time constants $T_{cont}$ and $T_{sns}$ are long, the feedback control becomes slow, whereby the rise time of the output bias becomes slow. On the other hand, if the time constants $T_{cont}$ and $T_{sns}$ are short, a change in feedback drive frequency is increase and exceeds the resonance frequency f0 of the piezoelectric transformer 101. As a result, a breakdown of the feedback control occurs. Accordingly, it is preferable that the time constants $T_{cont}$ and $T_{sns}$ are set to the appropriate length in the range of about 0.5 msec to 100 msec at the appropriate times. It is more preferable that the time constant $T_{cont}$ is set to the appropriate length in the range of about 1.0 msec to 10 msec, and the time constant $T_{sns}$ is set to the appropriate length in the range of about 0.5 msec to 5 msec.

Figure 5A:
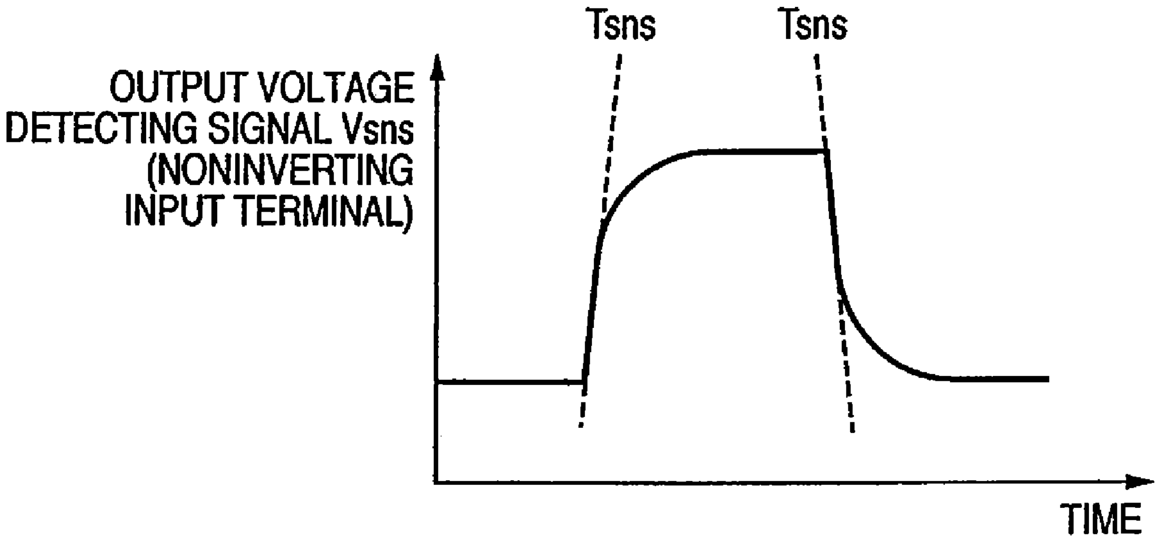
FIGS. 5A and 5B are timing charts representing the circuit characteristics of the high-voltage power supply unit using the piezoelectric transformer according to the first embodiment of the present invention.
Figure 5B:
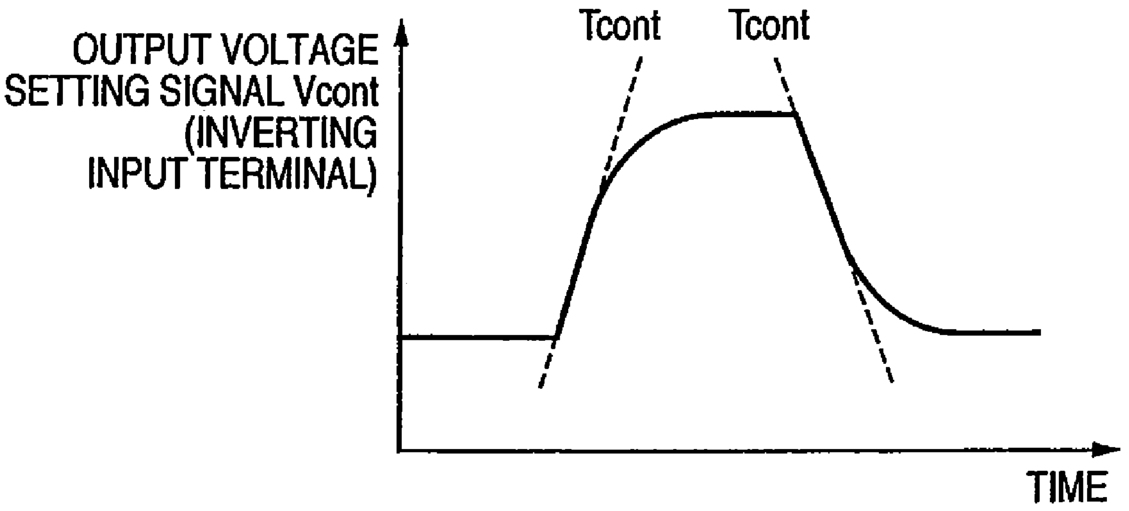

The circuit operation according to this embodiment will be described below with reference to FIGS. 5A and 5B. FIG. 5A shows the voltage waveform of the output voltage detecting signal $V_{sns}$ at the leading edge and trailing edge of the high voltage output. Both at the leading edge and trailing edge, the output voltage detecting signal $V_{sns}$ represents a waveform with the time constant $T_{sns}$. FIG. 5B shows the voltage waveform of the output voltage setting signal $V_{cont}$ at the leading edge and trailing edge of the high voltage output. Both at the leading edge and trailing edge, the output voltage setting signal $V_{cont}$ represents a waveform with the time constant $T_{cont}$. In this case, since $T_{cont}>T_{sns}$, the slope of the output voltage setting signal $V_{cont}$ is slower than that of the output voltage detecting signal $V_{sns}$. Hence, the time constant $T_{cont}$ of the output voltage setting signal $V_{cont}$ can be set larger than the time constant $T_{sns}$ of the output voltage detecting signal $V_{sns}$. In other words, the time constant $T_{cont}$ of the output voltage setting signal $V_{cont}$ is longer than the time constant of the output voltage detecting circuit 206. In this manner, a feedback circuit free from any oscillation can be formed.

In this embodiment, the time constants of an output voltage setting signal and output voltage detecting signal are determined by adjusting the constants of components which form the circuit. Hence, by using a simple and inexpensive arrangement, a voltage-controlled oscillator (VCO) in a high-voltage power supply unit using a piezoelectric transformer is prevented from being disabled for frequency control, thus realizing an ideal circuit control free from any oscillation.

Second Embodiment

In the above-described first embodiment, the time constants of an output voltage setting signal and output voltage detecting signal are adjusted by appropriately determining the component constants of resistors and capacitors which form the circuit. In this embodiment, a piezoelectric transformer high-voltage power supply unit capable of adjusting the time constants with an arrangement different from that in the above first embodiment will be described below with reference to FIGS. 6, 7, and 8A and 8B. Note that a description of the same arrangement as that in the first embodiment will be omitted.

This embodiment differs from the first embodiment in that firmware adjusts the time constant of an output voltage setting signal.

Figure 6:
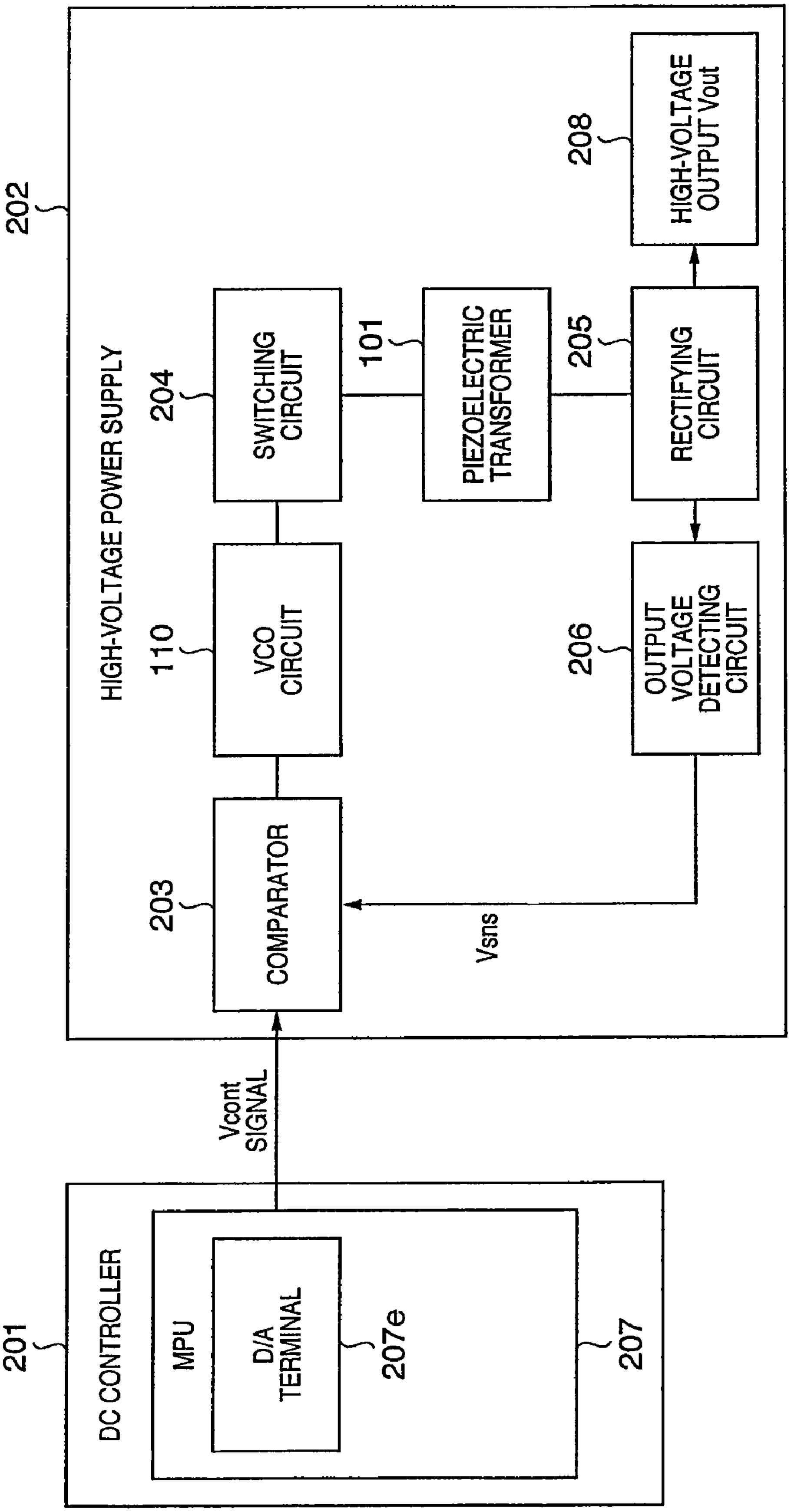
FIG. 6 is a block diagram showing a high-voltage power supply unit using a piezoelectric transformer according to the second embodiment of the present invention.

FIG. 6 is a block diagram showing the arrangement of the high-voltage power supply unit using the piezoelectric transformer according to this embodiment. The arrangement shown in FIG. 6 is almost the same as that shown in FIG. 4 according to the first embodiment. However, FIG. 6 reveals that an output voltage setting signal $V_{cont}$ is output from a D/A terminal 207*e* in an MPU 207 of a DC controller 201.

Figure 7:
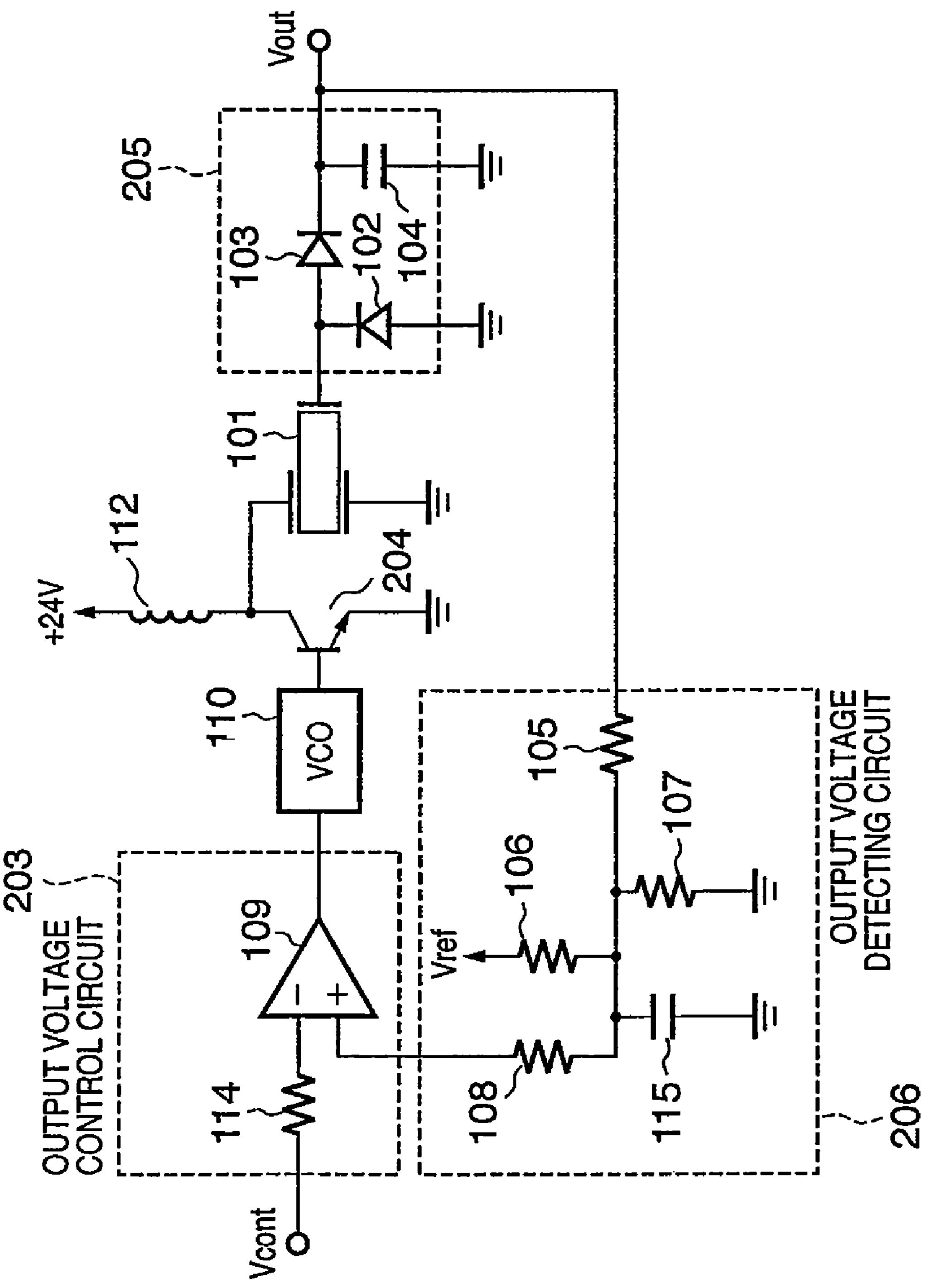
FIG. 7 is a circuit diagram showing the high-voltage power supply unit using the piezoelectric transformer according to the second embodiment of the present invention.

FIG. 7 is a circuit diagram showing an actual circuit arrangement of the transfer high-voltage power supply unit shown in FIG. 6. The circuit in FIG. 7 has almost the same arrangement as the circuit of FIG. 1 according to the first embodiment. However, an output voltage control circuit 203 in this embodiment does not have the capacitor 113 unlike the first embodiment.

A time constant $T_{sns}$ of an output voltage detecting signal $V_{sns}$ is determined by the component constants of an output voltage detecting circuit 206 consisting of resistors 105, 106, and 107 and capacitor 115. The output voltage setting signal $V_{cont}$ is controlled by firmware having a setting table for surely controlling the output voltage setting signal $V_{cont}$ to have a larger time constant than the time constant $T_{sns}$ of the output voltage detecting signal $V_{sns}$.

Figure 8A:
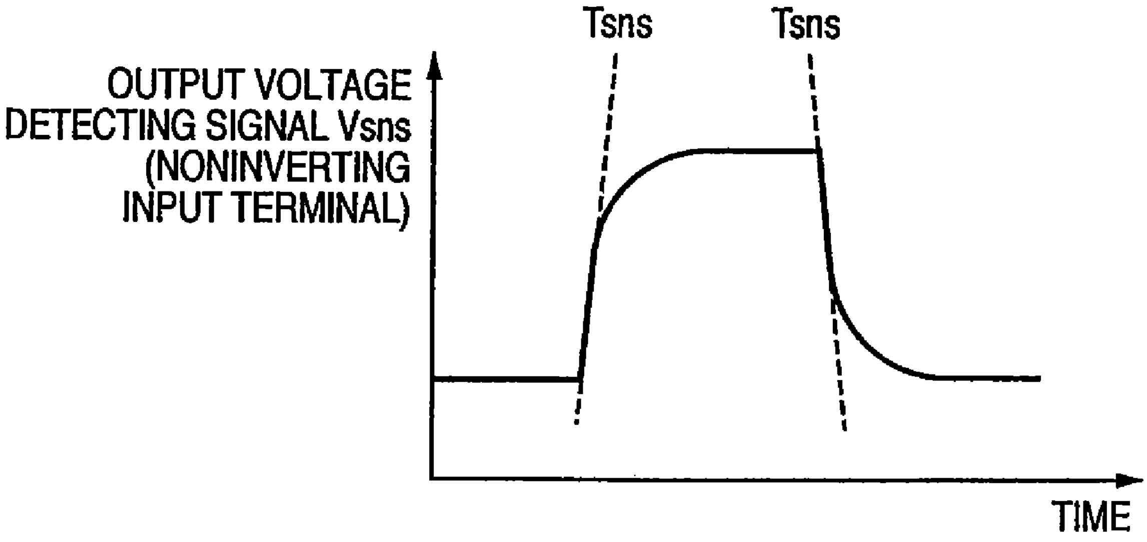
FIGS. 8A and 8B are timing charts representing the circuit characteristics of the high-voltage power supply unit using the piezoelectric transformer according to the second embodiment of the present invention.
Figure 8B:
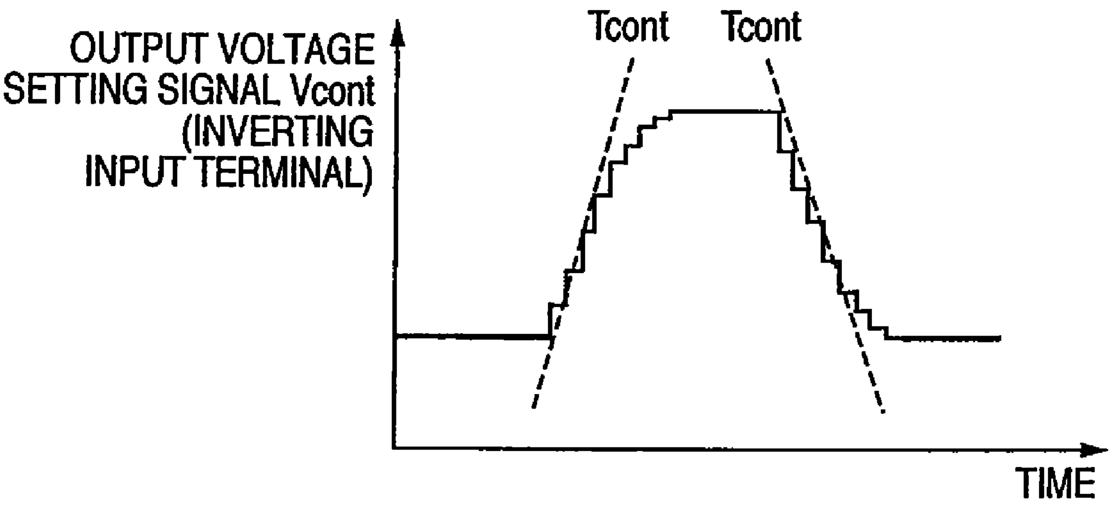

The circuit operation according to this embodiment will be described next with reference to FIGS. 8A and 8B. FIG. 8A shows the voltage waveform of the output voltage detecting signal $V_{sns}$ at the leading edge and trailing edge of the high voltage output. Both at the leading edge and trailing edge, the output voltage detecting signal $V_{sns}$ represents a waveform with the time constant $T_{sns}$. FIG. 8B shows the voltage waveform of the output voltage setting signal $V_{cont}$ at the leading edge and trailing edge of the high voltage output. The firmware controls the output voltage setting signal $V_{cont}$ in accordance with the setting table in which the output voltage setting signal $V_{cont}$ is set to represent a waveform with a time constant $T_{cont}$ both at the leading edge and trailing edge. In this case, since $T_{cont}>T_{sns}$, the slope of the output voltage setting signal $V_{cont}$ is slower than that of the output voltage detecting signal $V_{sns}$. Hence, even by using the firmware, the time constant $T_{cont}$ of the output voltage setting signal $V_{cont}$ can be surely set larger than the time constant $T_{sns}$ of the output voltage detecting signal $V_{sns}$, thus forming a feedback circuit free from any oscillation.

In this embodiment, the output voltage setting signal $V_{cont}$ is obtained from the D/A output of the MPU, and controlled by firmware. Hence, the voltage-controlled oscillator (VCO) can be prevented from being disabled for frequency control by using an arrangement different from that of the conventional circuit, thus realizing circuit control free from any oscillation.

Third Embodiment

In the above-described second embodiment, the time constant $T_{cont}$ of the output voltage setting signal $V_{cont}$ is adjusted by the firmware, and the time constant $T_{sns}$ of the output voltage detecting signal $V_{sns}$ is adjusted by the circuit constants. In this embodiment, a piezoelectric transformer high-voltage power supply unit capable of adjusting a time constant by using an arrangement developed from that of the above second embodiment will be described below with reference to FIGS. 9 and 10. Note that a description of the same arrangement as that in the first embodiment will be omitted.

This embodiment is different from the second embodiment mainly in that an output voltage detecting signal $V_{sns}$ is input to an MPU 207 and compared in the MPU 207 with an output voltage setting signal $V_{cont}$ to be output.

Figure 9:
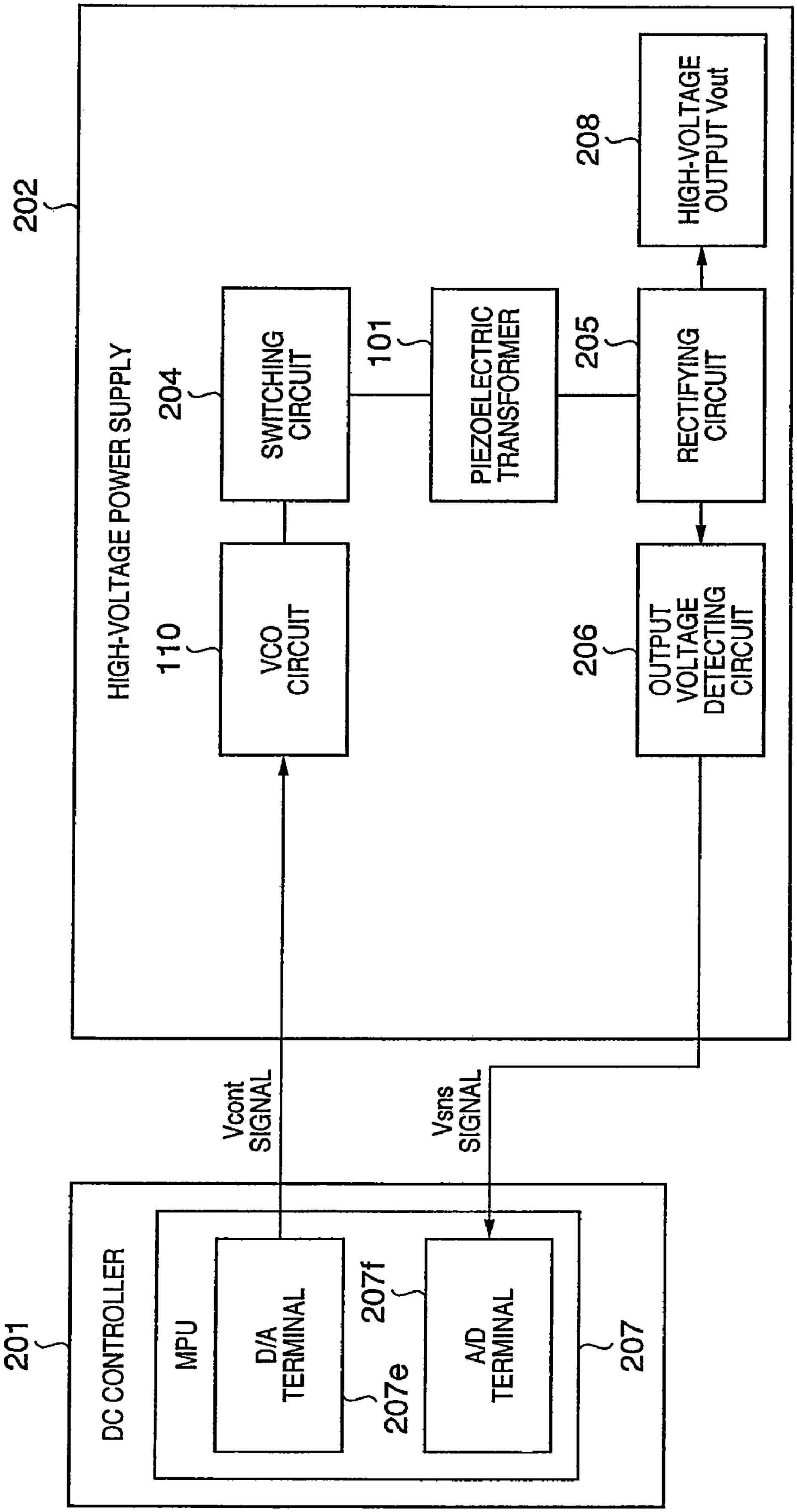
FIG. 9 is a block diagram showing a high-voltage power supply unit using a piezoelectric transformer according to the third embodiment of the present invention.

FIG. 9 is a block diagram showing the arrangement of a high-voltage power supply unit using a piezoelectric transformer according to this embodiment. A D/A terminal 207*e* of the MPU 207 mounted in a DC controller 201 outputs an output voltage setting signal $V_{cont}$. A rectified output voltage $V_{out}$ is fed back to an output voltage detecting circuit 206, and the output voltage detecting signal $V_{sns}$ is input to an A/D terminal 207*f* of the MPU 207. The MPU 207 controls the output voltage detecting signal $V_{sns}$ and output voltage setting signal $V_{cont}$ to have the same potential.

Figure 10:
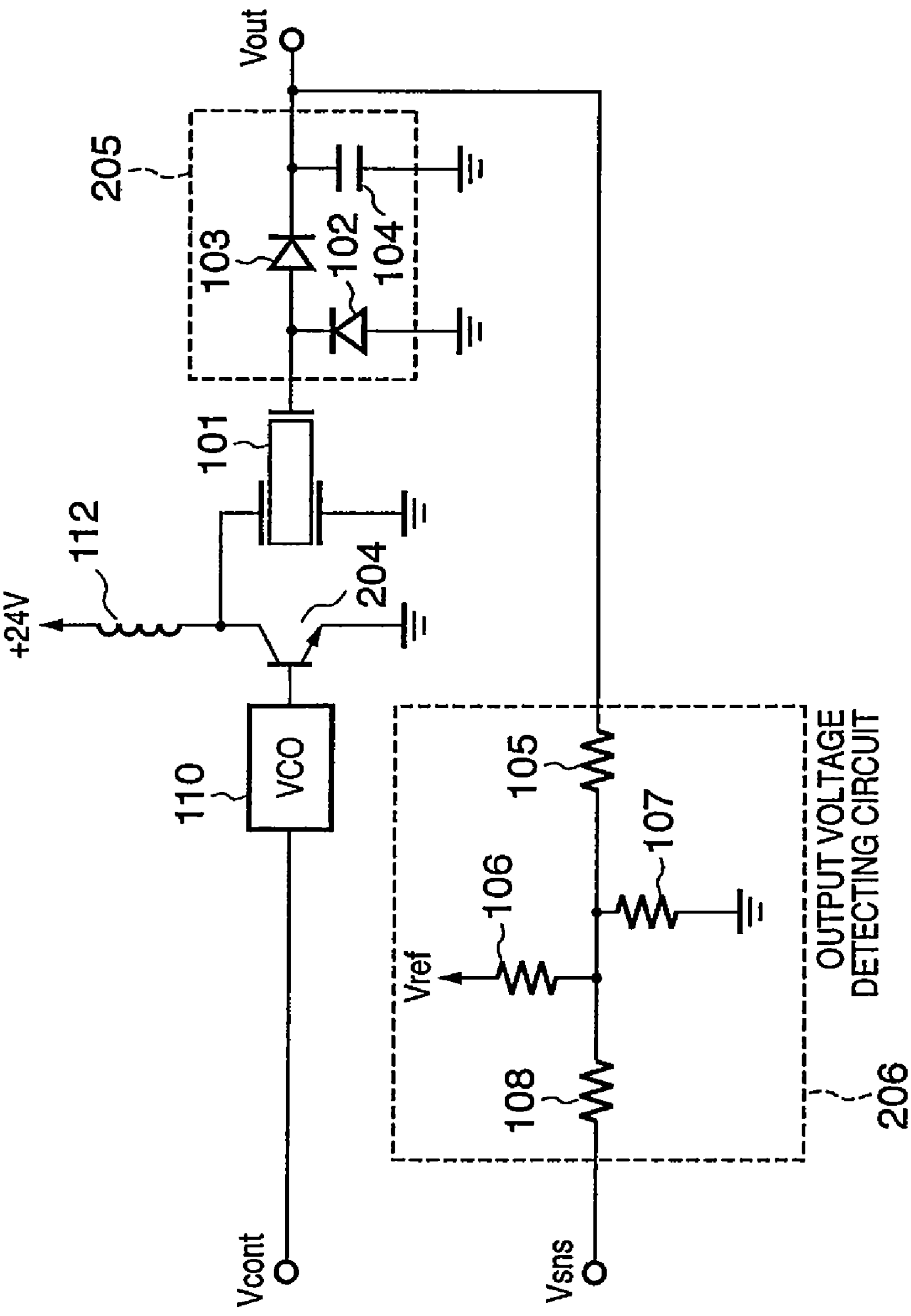
FIG. 10 is a circuit diagram showing the high-voltage power supply unit using the piezoelectric transformer according to the third embodiment of the present invention.

FIG. 10 is a circuit diagram showing an actual circuit arrangement of the transfer high-voltage power supply unit shown in FIG. 9.

The output voltage detecting signal $V_{sns}$ is input to the A/D terminal 207*f* of the MPU 207 upon being divided by resistors 105, 106, and 107 into voltages equal to or lower than a given voltage. At this time, the input time constant is $T_{sns}$.

To the contrary, the output voltage setting signal $V_{cont}$ is always compared with the output voltage detecting signal $V_{sns}$ by the processes of the MPU 207. The output voltage setting signal $V_{cont}$ is output depending on a time constant $T_{cont}$ larger than the time constant $T_{sns}$ to satisfy $T_{cont}>T_{sns}$. In this manner, the MPU 207 compares the output voltage setting signal $V_{cont}$ and output voltage detecting signal $V_{sns}$. Even in this case, as in the first and second embodiments, the time constant $T_{cont}$ of the output voltage setting signal $V_{cont}$ can be set larger than the time constant $T_{sns}$ of the output voltage detecting signal $V_{sns}$. This makes it possible to realize a feedback circuit free from any oscillation. Also in this embodiment, the MPU 207 compares the output voltage setting signal $V_{cont}$ and output voltage detecting signal $V_{sns}$. Hence, this embodiment is convenient in that no comparator such as an operation amplifier is required to be formed on a substrate.

In the above embodiments, the arrangement of a transfer high-voltage power supply unit for applying a voltage to a transfer roller in an image forming apparatus has been exemplified. With a similar arrangement, however, a charge high-voltage power supply unit for applying a voltage to a charge roller or developing high-voltage power supply unit for applying a voltage to a developing roller can be realized.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-106785 filed on Apr. 1, 2005, which is hereby incorporated by reference herein in its entirety.

What is claimed is:

1. A power supply unit in an image forming apparatus, comprising:

a piezoelectric transformer;

an output voltage detecting circuit configured to detect an output voltage of said piezoelectric transformer;

an output voltage control circuit configured to control an output voltage from said piezoelectric transformer, said output voltage control circuit comprising a comparator configured to receive an output voltage setting signal, together with an output voltage detecting signal fed back from said output voltage detecting circuit, to compare the output voltage setting signal and the output voltage detecting signal; and a driving frequency supplying circuit configured to generate a driving frequency signal of said piezoelectric transformer in accordance with a comparison result by said comparator, and to supply the driving frequency signal to said piezoelectric transformer, wherein a time constant of said output voltage control circuit is longer than a time constant of said output voltage detecting circuit.

2. The unit according to claim 1, wherein said image forming apparatus comprises:

a latent image forming unit configured to form an electrostatic latent image on an image carrier;

a developing unit configured to form a toner image on the electrostatic latent image;

a transfer unit configured to transfer the toner image onto a transfer material;

and a fixing unit configured to fix toner transferred onto the transfer material to the transfer material, wherein at least one of said latent image forming unit, developing unit, and transfer unit is applied the voltage output from said piezoelectric transformer.

3. The unit according to claim 1, wherein the time constant of the output voltage control circuit is variable.

4. The unit according to claim 1, wherein the time constant of the output voltage control circuit can be changed by firmware.

5. The unit according to claim 1, wherein the time constant of said output voltage detecting circuit is variable.

6. The unit according to claim 1, wherein the time constant of said output voltage detecting circuit can be changed by firmware.

7. A power supply circuit comprising:

a piezoelectric transformer;

an output voltage detecting circuit configured to detect an output voltage of said piezoelectric transformer;

an output voltage control circuit configured to control an output voltage from said piezoelectric transformer, said output voltage control circuit comprising a comparator configured to receive an output voltage setting signal, together with an output voltage detecting signal fed back from said output voltage detecting circuit, to compare the output voltage setting signal and the output voltage detecting signal; and a driving frequency supplying circuit configured to generate a driving frequency signal of said piezoelectric transformer in accordance with a comparison result by said comparator, and to supply the driving frequency signal to said piezoelectric transformer, wherein a time constant of the output voltage control circuit is longer than a time constant of said output voltage detecting circuit.

8. The circuit according to claim 7, wherein the time constant of the output voltage control circuit is variable.

9. The circuit according to claim 7, wherein the time constant of the output voltage control circuit can be changed by firmware.

10. The circuit according to claim 7, wherein the time constant of said output voltage detecting circuit is variable.

11. The circuit according to claim 7, wherein the time constant of said output voltage detecting circuit can be changed by firmware.

12. A power supply comprising:

a piezoelectric transformer;

an output voltage detecting portion configured to detect an output voltage of said piezoelectric transformer;

an output voltage controller configured to output an output voltage setting signal so as to control an output voltage from said piezoelectric transformer in accordance with an output voltage detecting signal fed back from said output voltage detecting portion; and a driving frequency supplying portion configured to generate a driving frequency signal of said piezoelectric transformer, and to supply the driving frequency signal to said piezoelectric transformer in accordance with the output voltage setting signal and the output voltage detecting signal, wherein the output voltage controller controls an output operation of the output voltage setting signal so that a time constant of the output voltage controller is longer than a time constant of said output voltage detecting portion.

* * * * *